United States Patent [19]
Klein

[11] Patent Number: 6,046,478
[45] Date of Patent: Apr. 4, 2000

[54] P-CHANNEL THIN FILM TRANSISTOR HAVING A GATE ON THE DRAIN REGION OF A FIELD EFFECT TRANSISTOR

[75] Inventor: Richard K. Klein, Mountain View, Calif.

[73] Assignee: Advanced Micro Devices, Inc., Sunnyvale, Calif.

[21] Appl. No.: 08/937,496

[22] Filed: Sep. 25, 1997

[51] Int. Cl.[7] .................................................... H01L 29/76
[52] U.S. Cl. ............................ 257/350; 257/59; 257/347; 257/368; 257/329; 257/330; 257/332

[58] Field of Search ............................... 257/59, 347, 350, 257/368, 329, 330, 332

*Primary Examiner*—Fetsum Abraham
*Attorney, Agent, or Firm*—Foley & Lardner

[57] ABSTRACT

A device structure and a method of forming the structure comprising a thin film transistor (TFT) in a contact opening of a conventional field effect transistor (FET) by using α-silicon in the opening and the vertical portion of the α-silicon functioning as the channel for the TFT and both the FET and TFT sharing a common drain contact.

11 Claims, 6 Drawing Sheets

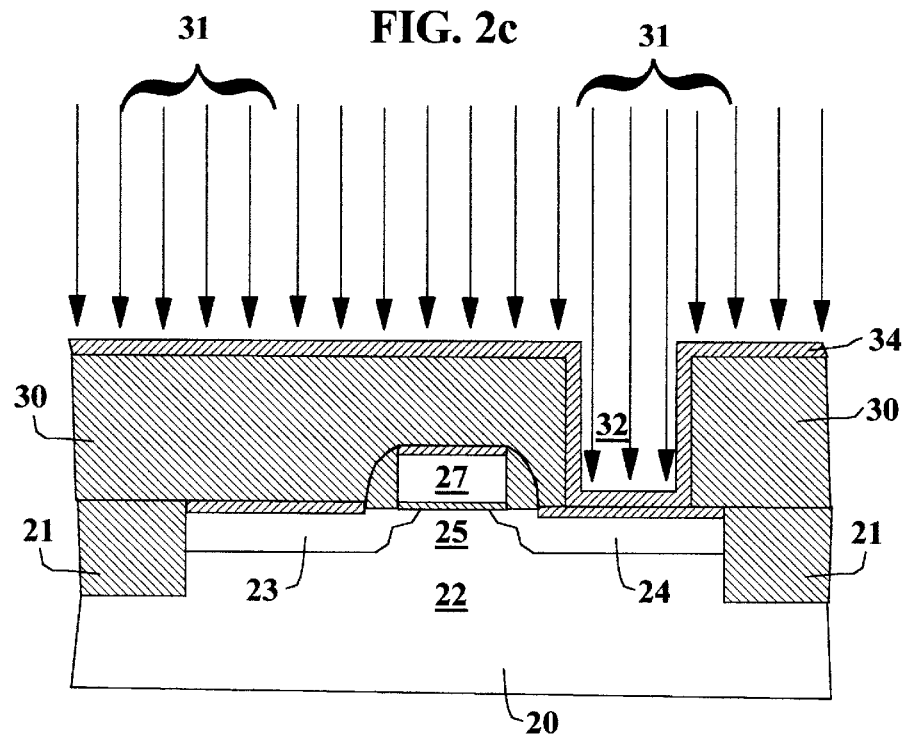
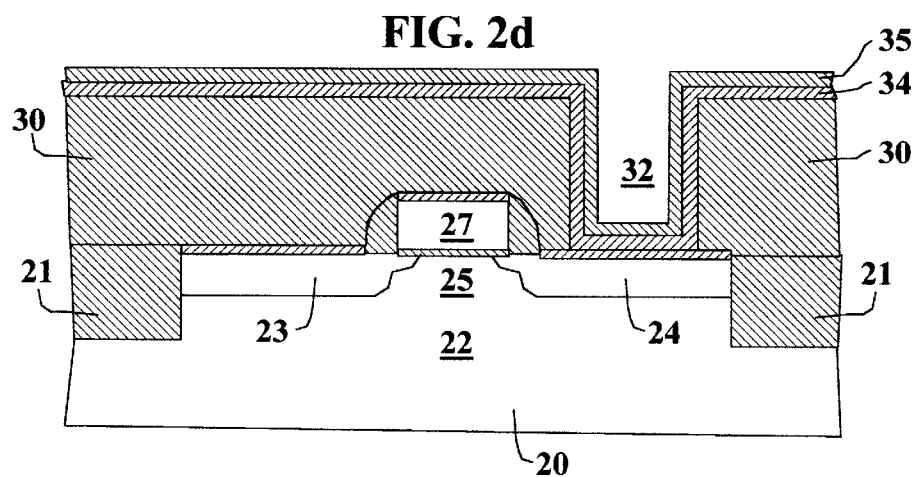
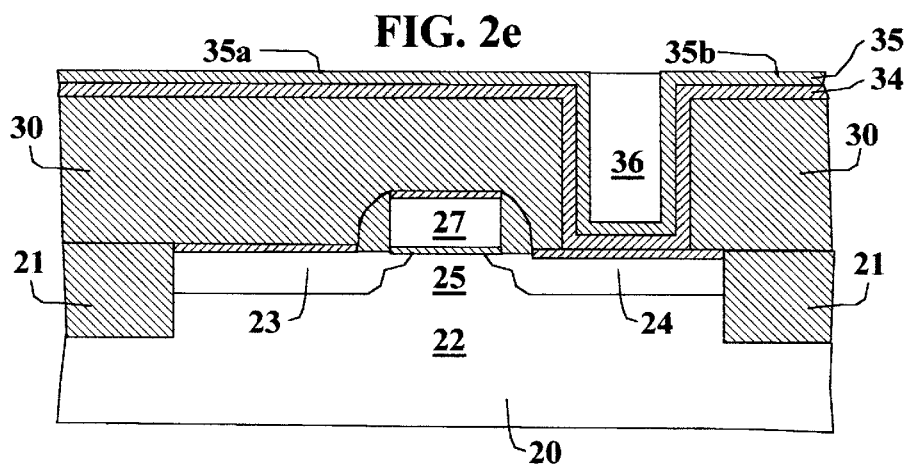

6,046,478

1

P-CHANNEL THIN FILM TRANSISTOR HAVING A GATE ON THE DRAIN REGION OF A FIELD EFFECT TRANSISTOR

FIELD OF THE INVENTION

The present invention relates to fabricating integrated circuits and, more specifically, to fabricating a P-channel thin film transistor and the resultant structure.

BACKGROUND OF THE INVENTION

With the demand for higher levels of integration in semiconductor chips, such as silicon semiconductor chips, to place more and more circuits in the semiconductor chips, a sizable reduction in the dimensions of the transistor of the integrated circuit is a critical step forward in meeting this demand. This is specially the case with a microprocessor integrated circuit chip of which a large portion of the real estate of the chip is an SRAM. For increased performance of future microprocessor, the storage capacity of the SRAM must increase thereby requiring a larger portion of real estate of the microprocessor.

A 1-bit storage cell in SRAM consists of a simple latch circuit with two stable operating points or nodes. Depending on the preserved state of a two-invertor latch circuit, the bit of data being held in the cell will be interpreted either as a logic "0" or as a logic "1". To access the data in the cell via a bit line, a switch controlled by a corresponding word line carrying a row address selection signal. Two complementary access switches are used to connect the 1-bit SRAM cell to the complementary bit lines. A field effect transistor (FET) SRAM cell consists of two cross-coupled invertors and two access transistors. The load devices may be polysilicon resistors, depletion-type N-type FET, or P-type FETs depending on the type of SRAM cell. Pass gates acting as data access switches are enhancement-type N-type FETs.

Since one form of a field effective transistor (FET) is a thin film transistor (TFT) whose dimensions are smaller than the conventional FET, the unitization of TFT in integrated circuits will reduce the amount of silicon needed to fabricate an equivalent number of circuits with conventional FETs. Further, if the TFT can be fabricated using a vertical portion of the silicon chip in contrast to a lateral portion, even more saving of silicon real estate is realized.

SUMMARY OF THE INVENTION

Accordingly, it is an object of the present invention to provide a method of fabricating an integrated circuits utilizing TFTs in combination with conventional FETs but not using any additional silicon real estate of a conventional FET.

Another object of present invention is to provide an integrated circuit fabrication method in which each of the TFTs share space with each of the conventional FETs.

A further object of the present invention is to design the TFT so that the TFT and the conventional FET share a common drain contact.

In accordance with the present invention, an integrated circuit silicon wafer is fabricated with a TFT in space normally occupied by a local interconnect in a conventional FET. The fabrication method comprises the steps of: forming a source, drain and gate of a FET; forming a planarized insulating layer over the FET; forming an opening in the insulating layer over the drain (or source) of the FET; lining the walls and bottom of the opening and the top surface of the opening on the insulating layer with an amorphous (α)

2 silicon having P-type impurities; lining the α-silicon with a layer of insulating material; filling the remaining opening with polysilicon having P-type impurities; and forming local interconnects, one on the α-silicon on the top of the insulating layer and the other on the polysilicon. The resultant conventional FET thus is both a conventional FET and a TFT in the same silicon real estate of a conventional FET and both share a common drain contact. In a six transistor SRAM, the conventional FET can function as a pull-down transistor and the TFT as a load transistor, with both transistors sharing a common drain. Accordingly, by fabricating the TFT in an area which is normally a contact opening for the drain of a conventional FET, valuable silicon real estate is saved.

BRIEF DESCRIPTION OF THE DRAWINGS

The foregoing and other objects, aspects and advantages will be better understood from the following detailed description of a preferred embodiments of the invention with reference in the drawings, in which:

FIG. 2c is a cross-sectional view of the portion of the semiconductor substrate of FIG. 2b with the horizontal portions of the α-silicon layer being implanted with a P-type impurity.

FIG. 2d is a cross-sectional view of the portion of the semiconductor substrate of FIG. 2c with a thin insulating layer deposited on the top surface of the thin α-silicon layer.

FIG. 2e is a cross-sectional view of the portion of the semiconductor substrate of FIG. 2d with the remaining space in the opening to the drain filled with doped polysilicon and planarized level with the top surface of the thin insulating layer.

DETAILED DESCRIPTION OF THE PREFERRED EMBODIMENTS OF THE INVENTION

Figure 1A:
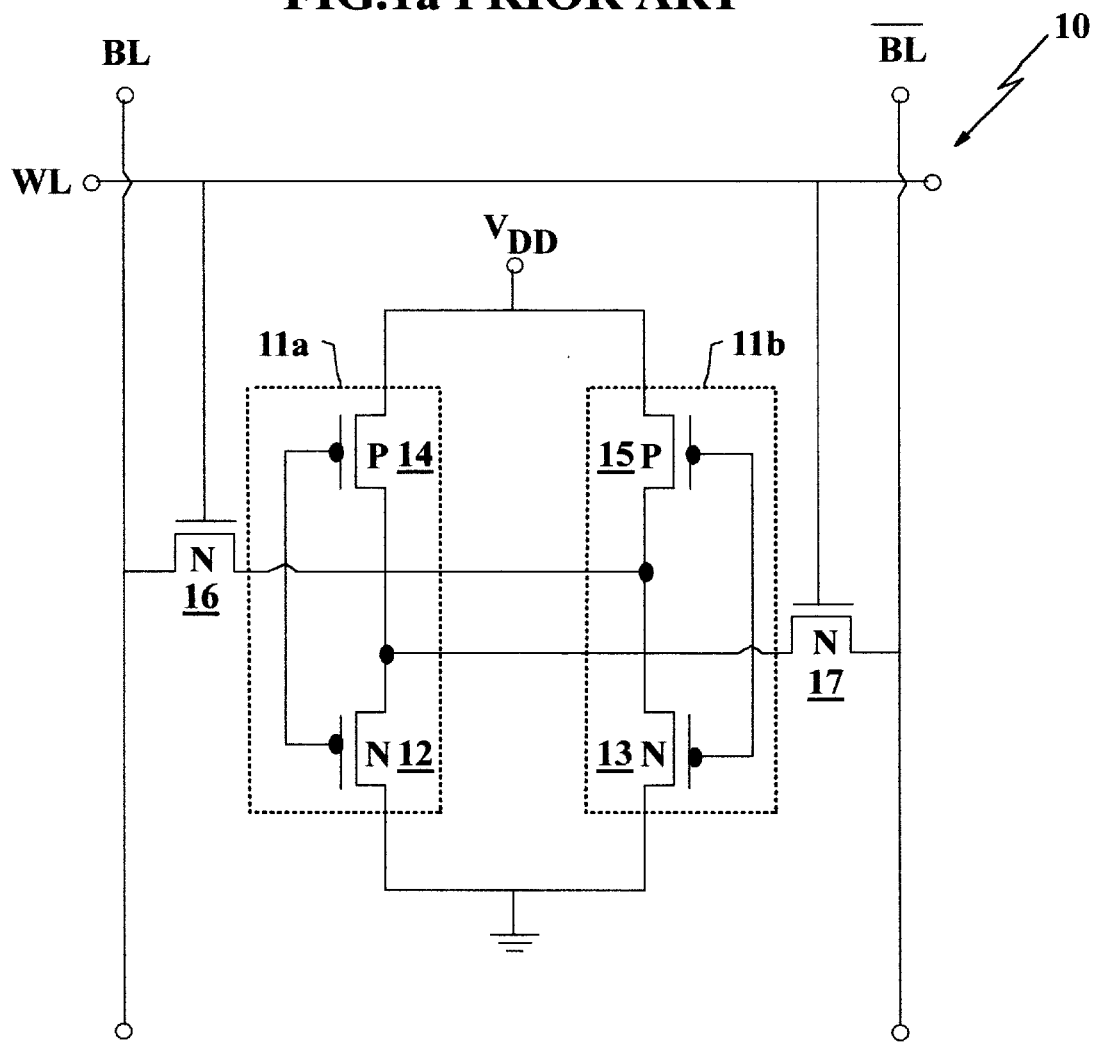
FIG. 1a is a schematic diagram of a prior art six transistor SRAM with dashed lines, each encircling a N-type transistor and a P-type transistor of the present invention.
Figure 1B:
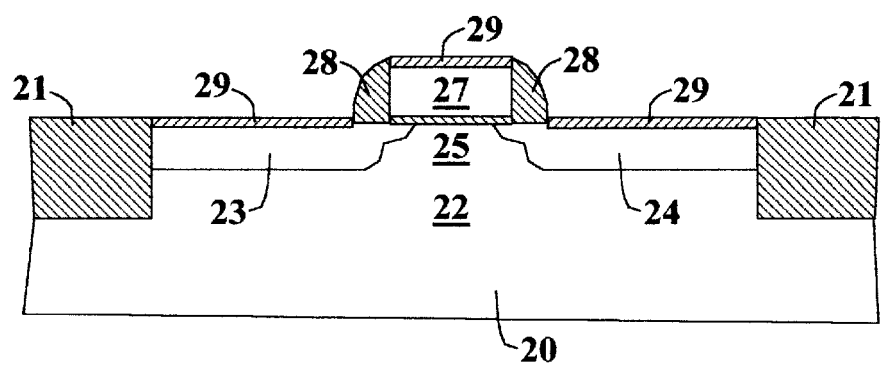
FIG. 1b is a cross-sectional view of the portion of a prior art semiconductor substrate having field isolation and with the source, drain and gate of a conventional field effect transistor (FET) and with a thin silicide layer over the source, drain and gate.
Figure 1C:
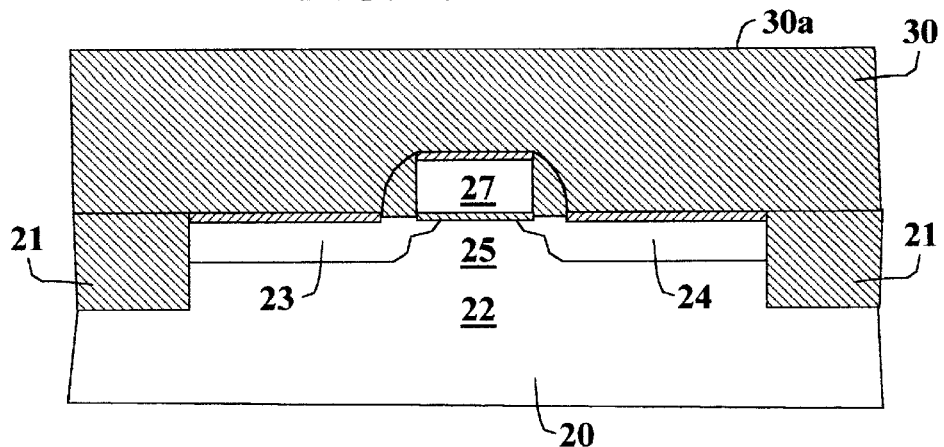
FIG. 1c is a cross-sectional view of the portion of the semiconductor substrate of FIG. 1b with a first thick planarized insulation layer over the FET of FIG. 1b.

Referring now to the prior art drawings of FIGS. 1*a*–*c*, FIG. 1*a* is a schematic circuit diagram of a six field effect transistor (FET) SRAM 10 with two dashed lines 11*a* and 11*b* each encircling a N-type transistor and a P-type transistor which form the basis of the present invention. The circuit diagram shows two N-type latch transistors 12, 13, two P-type load transistors 14, 15 and two N-type transfer transistors 16, 17. The gates of both transfer transistors are connected to a word line WL and the source of transistor 16 is connected to a bit line BL and the drain of transistor 17 is connected to a bit line BL (Donna, with a line over BL). The transfer transistor 16 is cross coupled to latch transistor 13 and load transistor 15, and transfer transistor 17 is cross coupled to latch transistor 12 and load transistor 14 so as to function as a flip-flop and permit the RAM to be static and retain the stored data when power is off.

FIG. 1*b* is a cross-sectional view of a portion of a semiconductor wafer, which is a silicon substrate 20 having field isolation 21, herein silicon oxide trenches, formed in the substrate on opposite sides of an area 22 in which a conventional FET is formed. The FET, herein a N-type FET, comprises a source 23 and a drain 24 in the area 22 and the source and drain are separated by a channel 25 under a gate oxide 26 and a gate 27. Insulating sidewalls 28 abut the sides of the gate 27 and, herein, are formed from a deposited layer of silicon oxide which has been anisotropically etched. To increase the conductivity of the local interconnects to the source 23, drain 24 and gate 27, a thin layer of a metal silicide 29, herein titanium silicide, is formed on the substrate surface above the source and drain and on the top of the gate. With the elements of the FET fabricated, a thick insulating layer 30 is deposited on the FET and the surface 30*a* of the layer 30 is planarized using chemical/mechanical (CMP) polishing with a commercially available slurry, as shown in FIG. 1*c*.

Figure 2A:
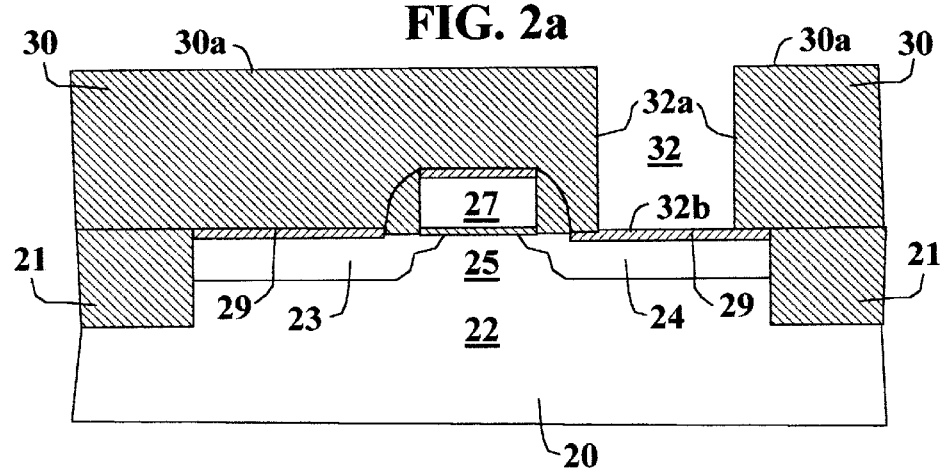
FIG. 2a is a cross-sectional view of the portion of the semiconductor substrate of FIG. 1c with an enlarged local interconnect opening formed in the thick insulating layer to the thin silicide layer over the drain in accordance with the present invention.

Now, in accordance with the present invention, a contact opening 32 having sidewalls 32*a* and a bottom 32*b* is formed in the insulating layer 30 to the metal silicate 29 over the drain 24, as shown in FIG. 2*a*. The contact opening 32 is about 1.5 to 2 times larger than a conventional contact opening. An undoped α-silicon layer 34 is deposited on the surface 30*a*, the sidewalls 32*a* and the bottom 32*b* as shown in FIG. 2*c*. The α-silicon layer 34 on the vertical sidewalls 32*a* will function as the channel 34*c* for the to-be-formed TFT. The horizontal portions, on the insulating layer 30 and at the bottom 32*a* of the opening 32, of the α-silicon layer 34 are implanted, preferably at 0°, with a P-type impurity, herein boron, as shown by the arrows of FIG. 2*c*. The horizontal portions of the α-silicon layer 34 on the upper surface 30*a* (FIG. 2*a*) of the insulating layer 30 and the bottom 32*b* (FIG. 2*a*) of the opening 32 will function as the drain and the source, respectively, of the TFT to-be-formed. In addition, the α-silicon layer 34 will serve as the local interconnect for the drain 24 of the conventional FET. Next, a thin insulating layer 35, which will serve as a gate oxide for the TFT, is deposited on the α-silicon layer as shown in FIG. 2*d*. The remaining portion of opening 32 is now filled with a conductive material 36, preferably polysilicon which herein is doped with a P-type impurity, herein boron, and planarized so that its top surface 36*a* is level with upper surface of the insulating layer 35 as shown in FIG. 2*d*. The end portions 35*a* and 35*b*, as shown in FIG. 2*c* of the insulating layer 35 on the surface 30*a* of the thick insulating layer 30 are masked (not shown) and etched to leave the drain 34*a* and source 34*b* of α-silicon layer 34 exposed as shown FIG. 2*f*.

Now, a second thick insulating layer 40 is formed on the surface 30*a* of the insulating layer 30, the exposed α-silicon layer 34, the thin insulating layer 35 and the top 36*a* of the polysilicon plug 36. The insulating layer 40 is masked (not shown) and contact openings 41, 42, and are formed in the insulating layer 43 with the contact opening 41 also being formed in insulating layer 30 to extend to the metal silicide 29 at the source 23 of the FET. Contact openings 42*a* and 42*b* extends to the exposed α-silicon layer 34 and to drain 34*a* and source 34*b* of the TFT, respectively, and contact opening 43 extends to the top 36*a* of the polysilicon plug 36 and is smaller in size than the polysilicon all so that the opening only contacts polysilicon as shown in FIG. 2*i*. With the openings formed, metal, preferably tungsten, is deposited in the openings 41, 42*a* and 42*b*, and 43 to create contacts 44, 45*a* and 45*b*, and 46 for the source of the FET, the drain of the FET and the TFT the source of the TFT, and the gate of the TFT, respectively.

To supplement the above general description of the present invention, a detailed description of fabricating the combined conventional FET and TFT of the present invention will now be given. A conventional prior art FET as shown in FIG. 1*b* with a silicon substrate 20 having field oxide isolation areas 21, which herein are shallow trenches filled with silicon oxide, but may also be LOCOS isolation. The area 22 in the silicon substrate between the trenches 21 is the active region of the conventional N-type FET. A source 23 and a drain 24 are formed in this active region by N-type impurities, herein arsenic, preferably by implantation and subsequent anneal to create a channel 25 beneath a gate oxide layer 26, which is thermally grown to be about 80 Å to about 100 Å. A gate 27, which is a conductive material, herein polysilicon is deposited on the gate oxide layer 26. The polysilicon gate 27 may be doped with an impurity either before or after deposition to lower its resistivity and make it more conductive. The source and drain include lightly doped drain (LDD) portions 23*a* and 24*a*, respectively, and the LDDs are formed by implanting phosphorus or arsenic impurities after the gate 27 is fabricated, which serves as an alignment mask for the implantation. After forming of the LDDs, sidewalls 28, which herein are silicon oxide, but also may be silicon nitride, are deposited on the walls of the polysilicon gate 27 from a conformal source of silicon, such as tetraethylothosilicate (TEOS). The deposited silicon oxide is anisotropically etched to form the sidewalls 28. With the sidewalls formed, the remainder of the source 23 and drain 24 is completed with the LDDs 23a and 24a, respectively, by implanting arsenic and annealing to activate and diffuse the implanted impurities. Preferably, a metal silicide 29, such as titanium silicide or tungsten silicide is deposited on the exposed surfaces of the source 23, the drain 24 and the gate 27 to increase the conductivity when contacts are made. Herein, the metal silicide is titanium silicide. To complete the prior art conventional N-type FET, a thick insulating layer 30 is deposited and it upper surface 30a is planarized as shown in FIG. 1c. Preferably, the insulating layer is deposited using low pressure chemical vapor deposition (LPCVD) with TEOS as the source at a temperature of about 700° C. to form a silicon oxide layer of a thickness in the range of about 5000 Å to about 8000 Å. The surface 30a and planarized using chemical/mechanical (CMP) with a commercial slurry.

Now turning to a more detailed description of the present invention, a contact opening 32 is formed in the insulating layer 30 to the drain 24. Preferably, the opening 32 is formed in the insulating layer 30, herein silicon oxide, by anisotropically etching with a parallel plate reactive ion etcher or any another conventional anisotropic etcher with carbon tetrafluoride and hydrogen as one of a number of know gases for etching silicon oxide. By using anisotropic etching, the walls 32a of the opening 32 are substantially vertical to the bottom 32b of the opening and extend to the titanium silicide layer 29 over the drain 24 of the conventional FET. The width of the contact opening 32 is about 1.5 to about 2 times larger than the dimensions of a conventional opening and preferably is about $0.8\mu$ in width as shown in FIG. 2a.

Figure 2B:
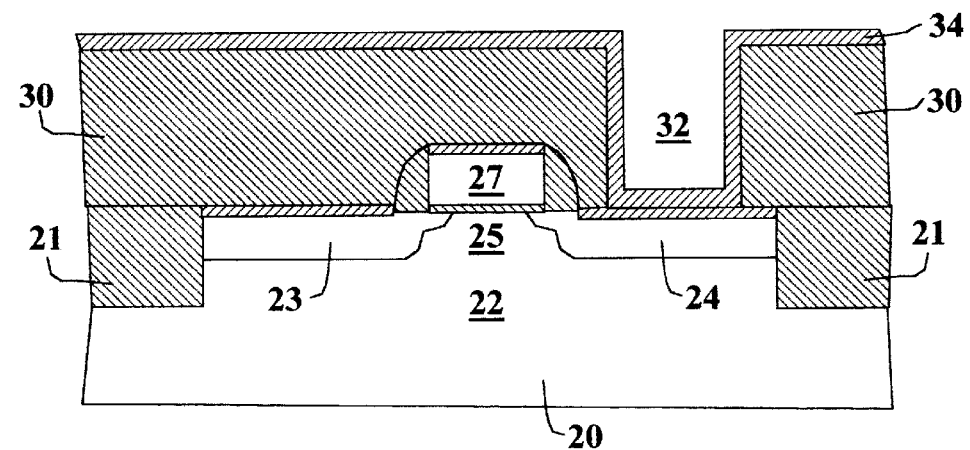
FIG. 2b is a cross-sectional view of the portion of the semiconductor substrate of FIG. 2a with a conformal α-silicon layer of the present invention on the top of the insulating layer and on the walls of the opening over the drain and on the silicide layer above the drain.
Figure 2F:
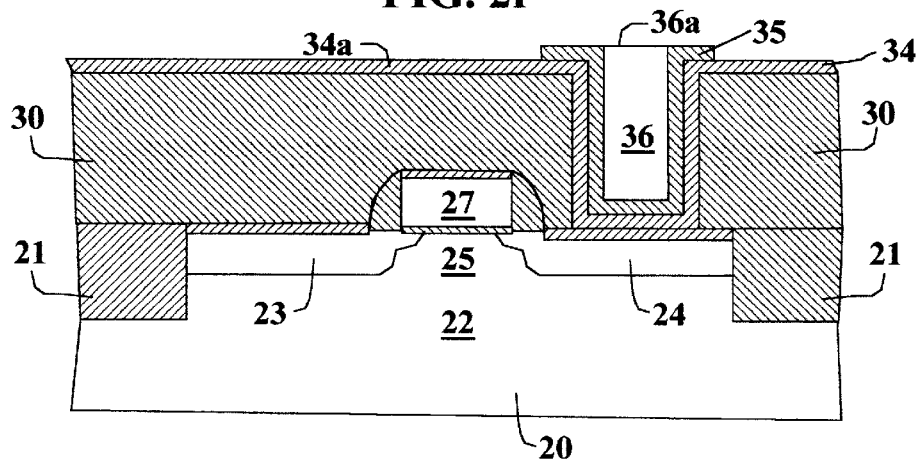
FIG. 2f is a cross-sectional view of the portion of the semiconductor substrate of FIG. 2e with the thin insulating layer etched back to leave the end portion of the α-silicon layer exposed.

Now, in accordance with the present invention, a conformal layer of α-silicon 34 is deposited on the walls 32a (FIG. 2b) and bottom 32b (FIG. 2b) of the contact opening 32 and the surface 30a (FIG. 2a) of the insulating layer 30 preferably by chemical vapor deposition (CVD) of silane at a temperature below 580° C. and, preferably, at about 560° C., as shown in FIG. 2b. The thickness of the α-silicon layer 34 is in the range of about 80 Å to about 150 Å and preferably is about 100 Å. The α-silicon layer 34 is undoped as deposited, but the horizontal portions of the layer 34 on the upper surface 30a of the insulating layer 30 are implanted with a P-type impurity, herein boron, at greater than about $10^{18}$ cm$^2$ as shown by the arrows 31 in FIG. 2c and functions as the drain 34a and 34b of the TFT with the channel 34c inbetween on the vertical sidewalls. Next, a conformal insulating layer 35 is CVD deposited on the α-silicon layer 34 preferably from a TEOS source to form a silicon oxide layer at a thickness range of about 100 Å to about 200 Å as shown in FIG. 2d. Preferably, the thickness of the silicon oxide layer 35 is about 150 Å. This silicon oxide layer will serve as the gate oxide for the TFT. The remaining portion of the opening 32, with the α-silicon layer 34 and silicon oxide layer 35 lining the walls 32a and bottom 32b, is filled with a conductive material 36, preferably polysilicon. The polysilicon 36 is deposited by CVD using silane as the source and at a temperature above 580° C., and herein about 700° C. After deposition, the upper surface 36a is planarized, preferably by CMP using a commercial slurry, level with the upper surface of the silicon oxide layer 35 as shown in FIG. 2e.

Figure 2G:
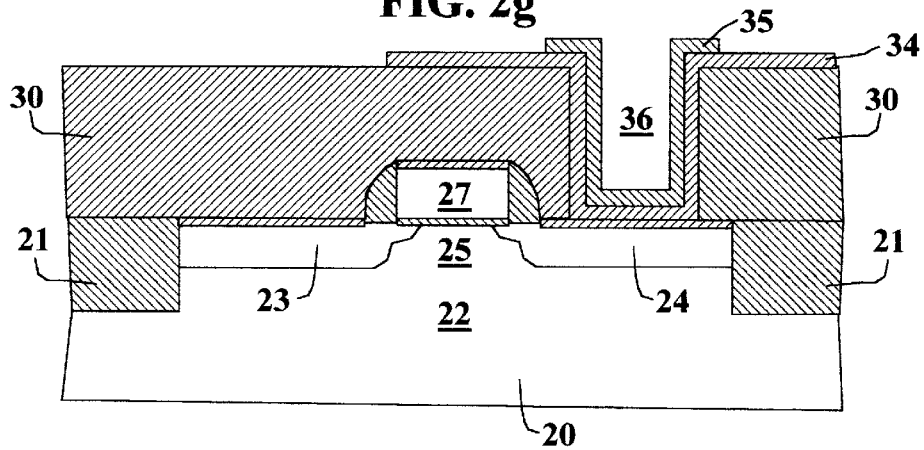
FIG. 2g is a cross-sectional view of the portion of the semiconductor substrate of FIG. 2f with the α-silicon layer etched back.

To be able to make contact with the TFT drain 34a and the TFT source 34b of the α-silicon layer 34 and to remove it from the source side of the conventional FET, all but the end portions 35a and 35b of the thin insulating layer 35 are masked (not shown) and the end portions are etched using a parallel plate reactive ion etcher with a plasma gas of carbon tetraflouride and hydrogen. Following the removal of the end portions 35a and 35b (FIG. 2f) of silicon oxide layer 35, the layer 35, the surface 36a of the polysilicon 36 and all but the end portion of the α-silicon layer 34 is masked (not shown) and the end portion is etched using the same parallel plate reactor but a plasma gas of carbon tetrafluoride and oxygen to remove end portion of the layer 34 as shown in FIG. 2g.

Figure 2H:
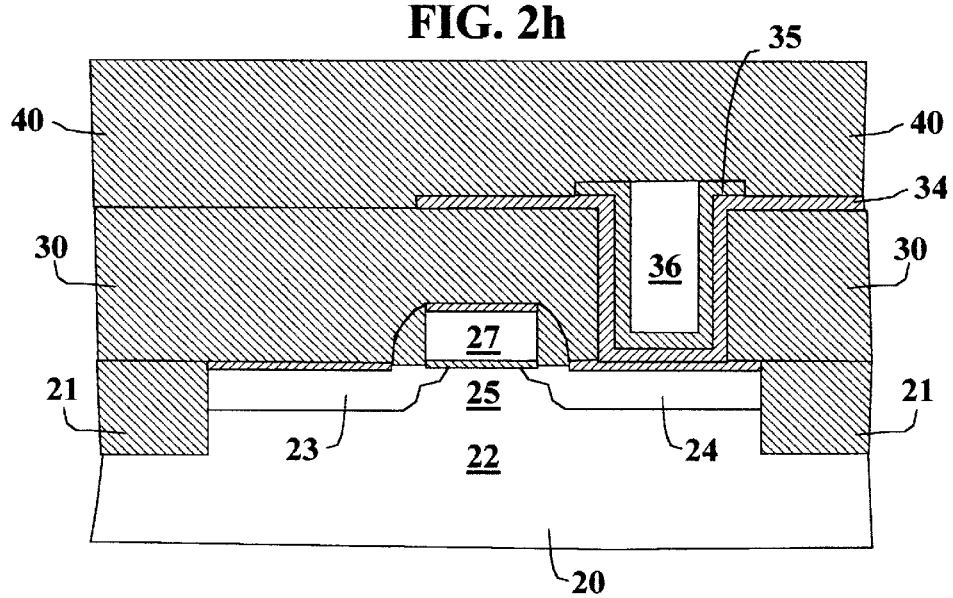
FIG. 2h is a cross-sectional view of the portion of the semiconductor substrate of FIG. 2g with a second thick insulating layer on the first insulating layer and covering the exposed end portion of the α-silicon layer, the thin insulating layer and the top of the polysilicon.
Figure 2I:
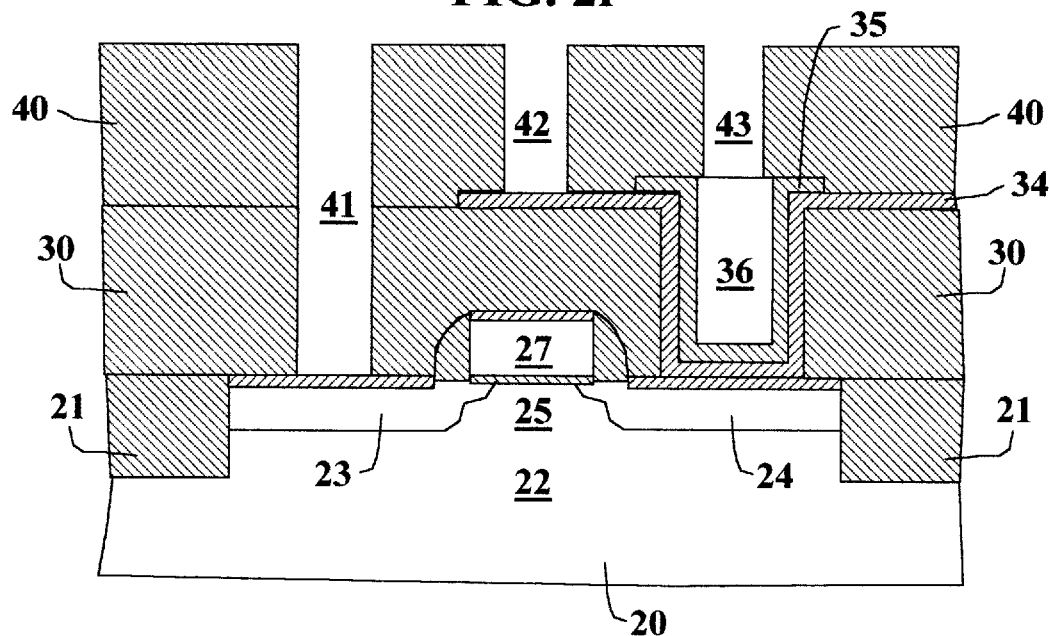
FIG. 2*i* is a cross-sectional view of the portion of the semiconductor substrate of FIG. 2*h* with two contact openings formed only in the second insulating layer to the exposed end portion of the α-silicon layer and to the top of the polysilicon and a third contact opening formed in both the second and first insulating layers to the source of the conventional FET.
Figure 2J:
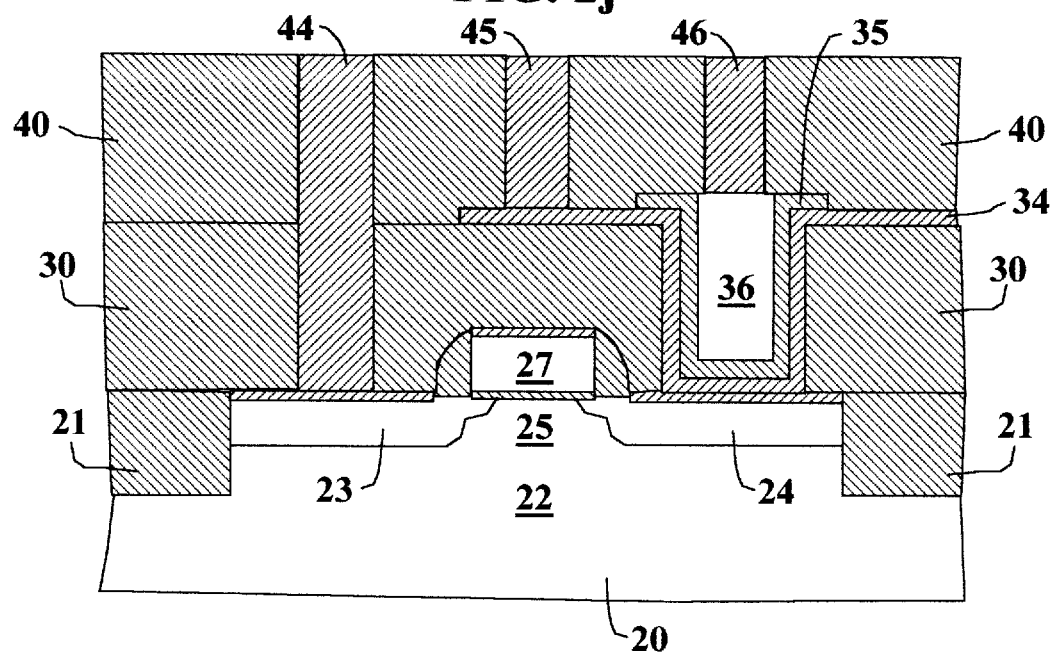
FIG. 2*j* is a cross-sectional view of the portion of the semiconductor substrate of FIG. 2*i* with the contact openings filled with a conductive material and with the surfaces of the conductive material planarized level with the second insulating layer.
Figure 2K:
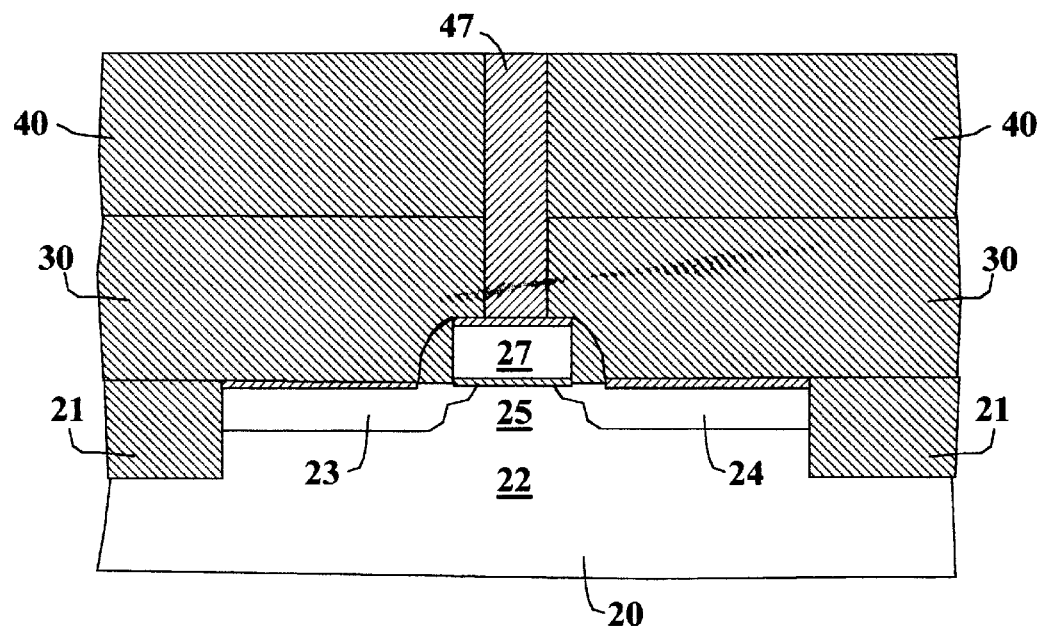
FIG. 2*k* is a cross-sectional view of the portion of the semiconductor substrate with a contact to the gate of the conventional FET.
Figure 2L:
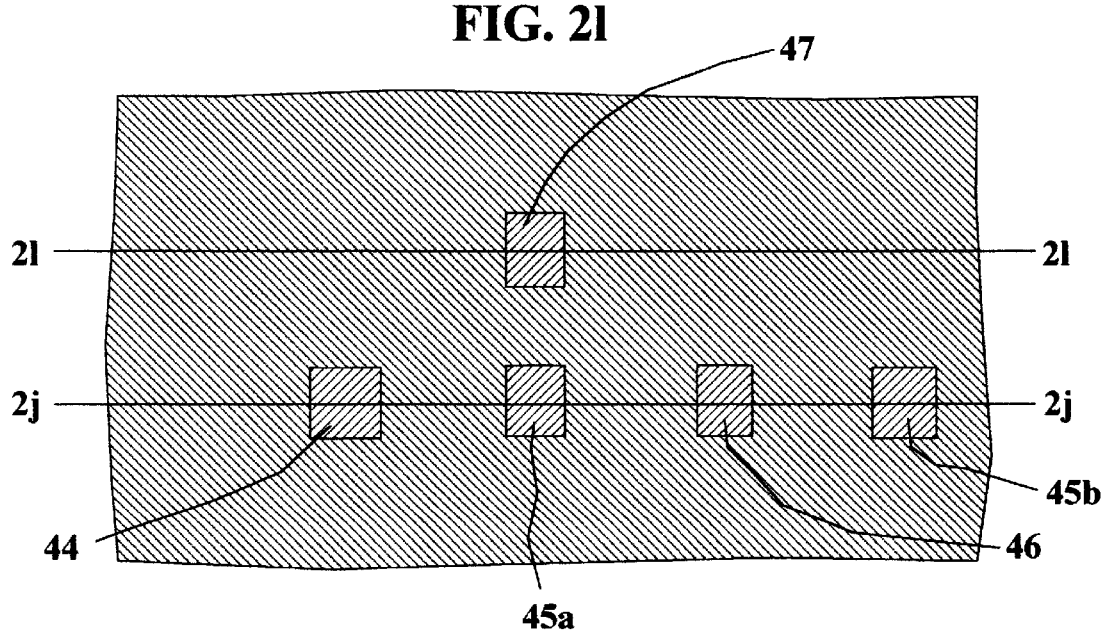
FIG. 2*l* is a plan top view of a portion of the semiconductor substrate after planarization and showing the cross-sectional lines taken at 2*j*—2*j* and 2*l*—2*l* across the contacts at the surface of the second insulating layer.

Now, a second thick insulating layer 40, herein silicon oxide from a source of TEOS, is CVD deposited on the surface 30a of the insulating layer 30, the exposed α-silicon layer 34, the thin insulating layer 35 and the top surface 36a of the polysilicon plug 36. Preferably, the second thick insulating layer is substantially the same thickness as the first thick insulating layer and ranges in thickness from about 5000 Å to about 8000 Å. After planarizing the insulating layer 40 by CMP and a commercial slurry as shown in FIG. 2h, the layer 40 is masked (not shown) and contact openings 41, 42a and 42b, and 43 are anisotropically etched in the insulating layer 40, as shown in FIG. 2i, with the contact opening 41 also being etched in first insulating layer 30 to extend the opening to the metal silicide 29 at the source 23 of the FET. A parallel plate reactor is used with carbon tetrafluoride and hydrogen as the plasma gas. Contact openings 42a and 42b now extends to the drain 34a and the source 34b of the TFT in the exposed α-silicon layer 34. In addition, a contact opening 43 extends to the top surface 36a of the polysilicon plug 36 and is smaller in size than the polysilicon surface 36a so that the opening 43 only contacts polysilicon as shown in FIG. 2i. Not shown in the cross-section of FIG. 2i is an opening extending to the gate 27 of the FET. With the openings formed, metal, preferably tungsten, is deposited in the openings to create contacts 44, 45a, 45b, and 46 for the source of the FET, the drains of the FET and the TFT, and the gate of the TFT, respectively and, as shown in a separate cross-section of FIG. 2k, a contact 47 for the gate 27 of the FET. Preferably, tungsten is the metal and it is CVD deposited from tungsten hexafluoride into the opening 41, into openings 42a and 42b to the drain 34a and source 34b of the α-silicon 34 and into the opening 43 to the polysilicon surface 36a to form contacts 44, 45, and 46, respectively, as shown in FIG. 2j. Contact 41 is the local interconnect for the source 23 and contact 42 is the local interconnect for the drain 24 of the conventional FET and the drain of the TFT. Contact 43 is the local interconnect for the gate of the TFT. After forming contacts 44, 45, and 46 the deposited metal is planarized with CMP and a commercial slurry to leave the contacts 44, 45a and 45b, and 46 level with the upper surface of the second insulating layer 40, as shown in FIG. 2j. FIG. 2l which shows the upper surface with the top of contacts 44, 45a, 45b, 46, and 47 for the source of the FET, the drain of the FET and TFT, the source of the TFT, the gate of the TFT, and the gate of the FET.

Due to foregoing method and resulting structure, a conventional FET is now the combination of a conventional FET and a TFT in the same amount of silicon real estate. Thus, in the fabrication a six transistor SRAM each of the load transistors can be combined as a TFT into a conventional FET by being formed in the drain contact opening, thereby reducing the size of the SRAM cell.

Although this invention has been described relative to specific materials, and apparatuses for depositing and etching these materials, it is not limited to the specific materials or apparatuses but only to their specific characteristics. Other materials and apparatus can be substituted for those described herein which will be well understood by those skilled in the microelectronics and semiconductor arts after appreciating the present invention.

Having thus described the invention, what is claimed is:

1. A combination field effect transistor (FET) and thin film transistor (TFT) comprising:
   a semiconductor substrate having a source and drain therein and a gate thereon for the FET;
   a first level insulation covering the semiconductor substrate and having a contact opening in insulation to the drain, said insulation having a horizontal top surface and said contact opening having vertical sidewalls and a horizontal bottom adjacent the drain;
   an α-silicon layer disposed vertically on the sidewalls and horizontally on the bottom of the opening and on the top surface of the insulation, said α-silicon layer having an end portion on the top surface;
   an insulating layer having a top surface and disposed on all of the α-silicon layer except the end portion and functioning as a gate insulator for the TFT;
   a conductive material filling the remaining portion of the opening to form a upper surface level with the top surface of the insulating layer and functioning as the gate for the TFT; and
   a conductive contact on the end portion of the α-silicon layer to serve as an local interconnect to the drains of the FET and TFT and a conductive contact on upper surface of conductive material filling the opening to serve as a local interconnect for the gate of the TFT.

2. The combined FET and TFT of claim 1 wherein an additional contact opening is formed in the first level insulation to the source of the FET and a conductive contact is disposed in the opening to serve as a local interconnect to the source.

3. The combined FET and TFT of claim 1 wherein said first level of insulation includes first and second layers of insulation and said local interconnect to the source extends through both layers of insulation.

4. The combined FET and TFT of claim 3 wherein the local interconnect to the gate of the TFT extends only through the second insulating layer.

5. The combined FET and TFT of claim 1 wherein the horizontal portions of the α-silicon layer are doped with a P-type impurity.

6. The combined FET and TFT of claim 1 wherein a vertical portion of the α-silicon layer serves as the channel for the TFT.

7. The combined FET and TFT of claim 1 wherein a thin layer of a metal silicide is disposed on the source, drain and gate of the FET.

8. The combined FET and TFT of claim 1 wherein the α-silicon layer serves as part of the local interconnect for the drain of the FET.

9. The combined FET and TFT of claim 1 wherein the FET and TFT are two transistors of a six transistor SRAM and the TFT functions as a load transistor.

10. The combined FET and TFT of claim 9 wherein the FET functions as a latch transistor in the SRAM.

11. The combined FET and TFT of claim 9 wherein the FET and TFT are one of two pairs of each two transistors in the six transistor SRAM and wherein the other pair of two transistors is an FET and TFT.

* * * * *